US006617605B2

(12) United States Patent
Winters

(10) Patent No.: US 6,617,605 B2
(45) Date of Patent: Sep. 9, 2003

(54) NONVOLATILE MEMORY CELL AND METHOD FOR PRODUCING THE MEMORY CELL

(75) Inventor: Reiner Winters, München (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 10/040,137

(22) Filed: Jan. 2, 2002

(65) Prior Publication Data

US 2002/0089886 A1 Jul. 11, 2002

Related U.S. Application Data

(63) Continuation of application No. PCT/DE00/02034, filed on Jun. 23, 2000.

(30) Foreign Application Priority Data

Jul. 1, 1999 (DE) .......................................... 199 30 531

(51) Int. Cl.$^7$ .............................................. H01L 29/12
(52) U.S. Cl. ........................................ 257/10; 257/316
(58) Field of Search ................... 257/10, 316; 365/129, 365/185.24, 185.26; 357/41, 30, 5

(56) References Cited

U.S. PATENT DOCUMENTS

| 4,486,769 A | 12/1984 | Simko |
| 4,843,446 A | 6/1989 | Nishino et al. |
| 4,884,111 A | 11/1989 | Nishino et al. |
| 4,888,629 A | 12/1989 | Harada et al. |
| 5,576,986 A | * 11/1996 | Matsuzaki et al. .......... 365/129 |
| 5,844,842 A | 12/1998 | Seki et al. |
| 5,870,337 A | 2/1999 | Akaogi et al. |

FOREIGN PATENT DOCUMENTS

JP    08 017 947    1/1996

* cited by examiner

*Primary Examiner*—David Nelms
*Assistant Examiner*—Thinh Nguyen
(74) *Attorney, Agent, or Firm*—Laurence A. Greenberg; Werner H. Stemer; Ralph E. Locher

(57) ABSTRACT

An EPROM-like memory includes a substrate having a source region, a drain region, and a channel. The memory includes a gate stack formed by a gate oxide, a storage electrode, a second gate oxide and a gate electrode. The gate oxide is configured on the substrate above the channel. The storage electrode is configured on the gate oxide. The second gate oxide is configured on the storage electrode. The gate electrode is configured on the second gate oxide. The memory includes an interspace that is configured between the drain region and the storage electrode. The interspace is filled with a gas or contains a vacuum. The memory includes an outer spacing web that is configured laterally beside the gate stack. The outer spacing web is also configured on the drain region. The outer spacing web is made of doped polycrystalline silicon.

11 Claims, 6 Drawing Sheets

NONVOLATILE MEMORY CELL AND METHOD FOR PRODUCING THE MEMORY CELL

CROSS-REFERENCE TO RELATED APPLICATION

This application is a continuation of copending International Application No. PCT/DE00/02034, filed Jun. 23, 2000, which designated the United States.

BACKGROUND OF THE INVENTION

FIELD OF THE INVENTION

The invention relates to a nonvolatile memory cell and to a method for producing the memory cell. A nonvolatile memory is typically an EPROM (electrically programmable read only memory) or an EPROM-like memory, such as an EAROM (electrically alterable ROM), an EEPROM (electrical erasable PROM), a Flash-EPROM or an OTPROM (one-time programmable ROM). Tunnel contacts, also called tunnel junctions, are used in a large number of semiconductor components, such as tunnel diodes and nonvolatile memories. Tunnel contacts are electrical connections between two electrodes that, in the classical sense, must be considered as being insulated from each other. If the two electrodes are spaced apart by a small distance of only a few nanometers, then quantum mechanisms explain the current flow between the electrodes when a voltage is applied. In this case, the electrons do not overcome the potential barrier that is arranged between the electrodes as a result of applying an appropriately high voltage to lift the electrons into the conduction band of the potential barrier. In this case, significantly lower voltages establish a current flow between the electrodes. This current flow is called the tunnel current and tunnels through the insulating barrier between the electrodes.

Current rewriteable, permanent semiconductor memories are based on an MOS transistor (metal oxide semiconductor) that has an additional electrically insulating storage electrode (floating gate) located between its channel and its gate electrode. Typically, the storage electrode is completely insulated by a thin oxide layer and is charged and discharged by a tunnel current that is produced by Fowler-Nordheim tunneling or by high-energy electrons (hot electrons). During the charging and discharging of the storage electrodes, electrons tunnel through the thin oxide layer. As a result of the high-energy tunnel electrons, faults, such as broken bonds, occur in the thin oxide layer. These faults can form a conductive path between the storage electrode and the channel, or between the storage electrode and the source region. The charge flows away from the storage electrode via such a conductive path, even if no voltage is present on the gate, source or drain, and the storage cell loses the information stored in it. As a result of the produced conductive path, the lifetime of the memory is presently limited to about $10^6$ writing and erasing processes. Nonvolatile memory cells of this type are described, for example, in U.S. Pat. No. 5,844,842 and in U.S. Pat. No. 5,870,337. The degradation of the insulating film that insulates the floating gate electrode, and therefore the formation of a conductive path, is also described there.

SUMMARY OF THE INVENTION

It is accordingly an object of the invention to provide an EEPROM-like memory and a method for producing the memory which overcome the above-mentioned disadvantages of the prior art apparatus and methods of this general type.

In particular, it is an object of the invention to provide a nonvolatile memory cell in which a parasitic, possibly permanent conductive current path is avoided.

With the foregoing and other objects in view there is provided, in accordance with the invention, an EPROM-like memory that includes a substrate having a source region, a drain region, and a channel. The memory includes a gate stack formed by a gate oxide, a storage electrode, a second gate oxide and a gate electrode. The gate oxide is configured on the substrate above the channel. The storage electrode is configured on the gate oxide. The second gate oxide is configured on the storage electrode. The gate electrode is configured on the second gate oxide. The memory includes an interspace that is configured between the drain region and the storage electrode. The interspace contains either a gas or a vacuum. The memory includes an outer spacing web that is configured laterally beside the gate stack. The outer spacing web is also configured on the drain region. The outer spacing web is made of doped polycrystalline silicon.

The tunnel barrier that is used in the present invention consists of gas or is a vacuum. As opposed to silicon oxide, which is normally used as the tunnel barrier in rewriteable, permanent semiconductor memories, the tunnel barrier that consists of gas or that is a vacuum is degradation-free. The tunnel contact includes a first electrode 1, a second electrode 2, and an interspace 3 that is located between the first electrode 1 and the second electrode 2. The interspace 3 is filled with gas or is evacuated.

The distance between the first electrode 1 and the second electrode 2 is such that a tunnel current can flow between the two electrodes.

Since the interspace 3 is filled with gas or is evacuated, it is sealed off all around. The surface of this termination and therefore the surface of the interspace 3 is formed both by the first electrode 1 and by the second electrode 2. Since the two electrodes are insulated from each other, part of the surface of the interspace 3 consists of an insulating material. If a current flows from the first electrode 1 to the second electrode 2, then the current is divided into two partial currents. The first partial current represents a tunnel current through the interspace 3 and the second partial current represents a current along the surface of the insulating material which forms part of the surface of the interspace 3. Therefore, the current that flows between the first electrode 1 and the second electrode 2 at least partially tunnels through the interspace 3 that is filled with gas or that is evacuated.

In another embodiment, any current that flows between the first electrode 1 and the second electrode 2 tunnels through the interspace 3 that is filled with gas or that is evacuated. This ensures that the electrical connection between the two electrodes is produced exclusively via the interspace 3. Even if a further dielectric layer, which is not free of degradation by tunnel currents, is arranged between the first electrode 1 and the second electrode 2, in series with the interspace 3, then this is inconsequential for the functioning of the tunnel contact, since the interspace 3 continues to separate the two electrodes from each other as a degradation-free barrier.

Advantageously, the tunnel contact is integrated into a rewriteable, permanent semiconductor memory. As a result, the lifetime of the semiconductor memory is advantageously substantially lengthened and far more writing and erasing processes than the currently usual $10^6$ are possible.

Preferably, the storage electrode 11 of a memory cell 10 is charged or discharged via the tunnel contact. As a result, the advantageous properties of the tunnel contact are integrated into the existing structures for producing nonvolatile semiconductor memories.

In an advantageous embodiment of the invention, the memory 10 is an EPROM-like memory, such as an EAROM, EEPROM, EPROM, Flash-EPROM or an OTPROM.

A first additional tunnel layer 4 is arranged between the first electrode 1 and the interspace 3 and/or a second additional tunnel layer 5 is arranged between the second electrode 2 and the interspace 3. The additional tunnel layers 4 and 5 are protective layers for the electrodes 1 and 2, which can consist of for example, an oxide layer. The first additional tunnel layer 4, or respectively, the second additional tunnel layer 5 do not reduce the advantageous properties of the degradation-free tunnel contact, since even if the first additional tunnel layer 4 or the second additional tunnel layer 5 become conductive as a result of degradation effects, the interspace 3 continues to be present as a degradation-free tunnel barrier that insulates the first electrode 1 from the second electrode 2.

In another embodiment, the first electrode 1 has a first region 6 and/or the second electrode 2 has a second region 7. The first region 6, or respectively, the second region 7 has the task of leading the tunnel current between the first electrode 1 and the second electrode 2 preferably through the first region 6 or the second region 7. It is known from electrodynamics that currents preferably emerge from points, corners and edges, since the latter exhibit high field divergence. This effect is used in order to lead the tunnel current between the first electrode 1 and the second electrode 2 in an advantageous way through the first region 6 or the second region 7. Furthermore, it is consequently possible to operate the tunnel junction at low voltages, which has an advantageous effect on the periphery of the memory, which can be designed in a more space-saving way to produce correspondingly lower voltages.

With the foregoing and other objects in view there is also provided, in accordance with the invention, a method for producing an EPROM-like memory, which includes steps of: introducing a source region and a drain region into a substrate; forming a gate stack by applying a gate oxide to the substrate, applying a storage electrode to the gate oxide, applying a second gate oxide to the storage electrode, and applying a gate electrode to the second gate oxide; depositing a sacrificial spacing web laterally on the gate stack; forming an outer spacing web beside the sacrificial spacing web; and removing the sacrificial spacing web and etching underneath the gate stack such that the gate oxide is at least partly removed and a right-side interspace is formed between the drain region and the storage electrode.

The gate oxide is at least partially removed by etching underneath the gate stack and by subsequently closing the under-etching to form an interspace between the drain region and the storage electrode. The formation is filled with gas or a vacuum. Alternatively, the interspace could be formed between the source region and the storage electrode.

One advantageous embodiment of the production method includes forming the tunnel contact in an EPROM-like memory, such as an EAROM, EEPROM, EPROM, Flash-EPROM or an OTPROM.

A first additional tunnel layer 4 is formed between the first electrode 1 and the interspace 3 and/or a second additional tunnel layer 5 is formed between the second electrode 2 and the interspace 3. The additional tunnel layers 4 and 5 serve as a protective layer for the electrodes 1 and 2.

The first electrode 1 is formed with a first region 6 and/or the second electrode 2 is formed with a second region 7 so that during the operation of the arrangement, a tunnel current preferably flows through the first region 6 and through the second region 7.

Other features which are considered as characteristic for the invention are set forth in the appended claims.

Although the invention is illustrated and described herein as embodied in a nonvolatile memory cell and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
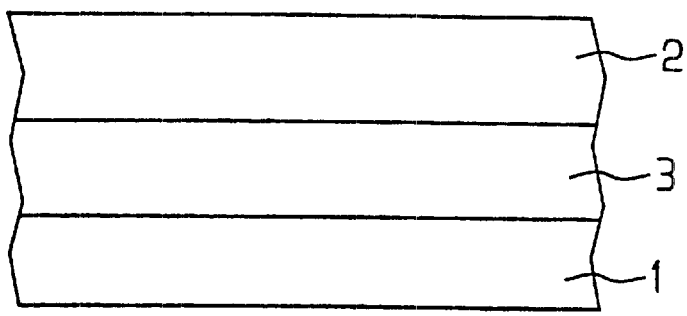
FIG. 1 shows an exemplary embodiment of a tunnel contact.

It should be understood that identical reference symbols have been used throughout the figures to designate identical or functionally identical elements. Referring now to the figures of the drawing in detail and first, particularly, to FIG. 1 thereof, there is shown a tunnel contact that includes a first electrode 1, a second electrode 2, and an interspace 3. The first electrode 1 and the second electrode 2 can consist of different materials, such as metals, semiconductors, silicides, or nitrides. For example, titanium, tungsten, tantalum, molybdenum, silicon, polysilicon, doped silicon, tungsten silicide, tungsten nitride, titanium silicide, titanium nitride, and further combinations of the aforementioned materials can be used. The interspace 3, which is located between the first electrode 1 and the second electrode 2, is filled with gas or is evacuated. The gases which fill the interspace 3 are preferably inactive (inert) gases, such as nitrogen or argon. In addition, gas residues that are liberated while the interspace 3 is sealed or during the production of the second electrode 2, such as phosphorus, boron, silane, hydrogen, and/or oxygen, can be found in the interspace 3. The first electrode 1 and the second electrode 2 are arranged such that a tunnel current can flow through the interspace 3.

Figure 2:
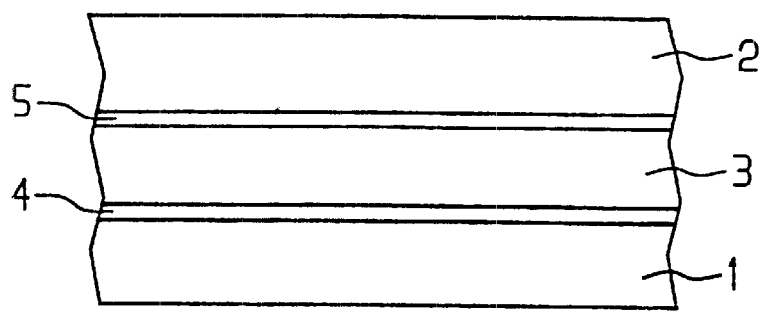
FIG. 2 shows another exemplary embodiment of a tunnel contact.

A further embodiment of a tunnel contact is shown in FIG. 2, and differs from the embodiment shown in FIG. 1 by the addition of a first additional tunnel layer 4 and a second additional tunnel layer 5. The two additional tunnel layers can be, for example, natural or processed dielectric layers that have been produced by oxidizing the first electrode 1 and second electrode 2. It is also possible for the additional tunnel layers 4, 5 to be deposited dielectric layers that are produced, for example, by a CVD process (chemical vapor deposition).

Figure 3:
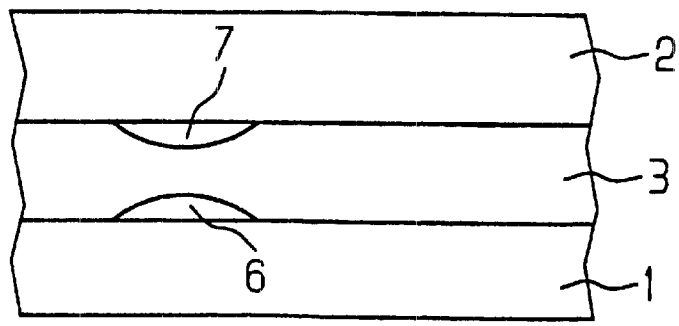
FIG. 3 shows another exemplary embodiment of a tunnel contact.

Another embodiment of the tunnel contact is shown in FIG. 3, and differs from the variant shown in FIG. 1 by the addition of a first region 6 and a second region 7. The first region 6 and the second region 7 locally reduce the thickness of the tunnel barrier, and as a result, concentrate the tunnel current on this area of the tunnel barrier, since the current intensity of a tunnel current depends exponentially on the thickness of the tunnel barrier. Furthermore, the first region 6 and the second region 7, as a result of their geometric shape, modify the electric field locally, so that a tunnel current, which emerges preferentially from points, corners and edges, preferably flows through the first region 6 and the second region 7. This arrangement makes it possible for the tunnel current between the first electrode 1 and the second electrode 2, which usually crosses over at a random point between the electrodes, to be concentrated specifically on the first region 6 and the second region 7.

Figure 4:
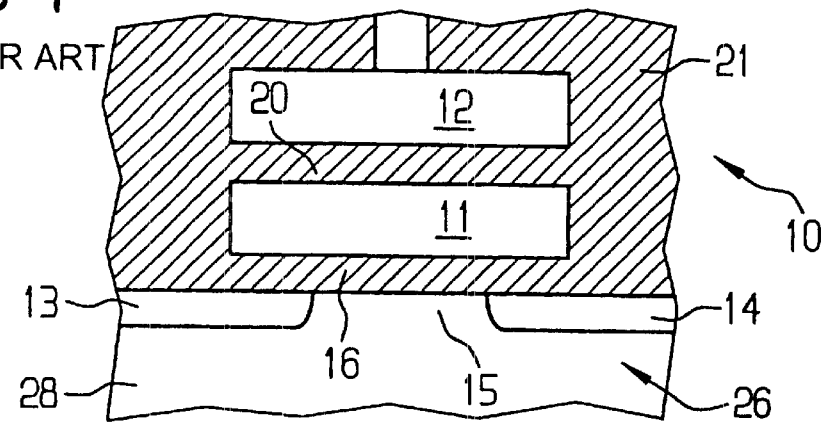
FIG. 4 shows an exemplary embodiment of a prior art EPROM-like memory cell.

FIG. 4 illustrates the basic construction of a prior art EPROM-like memory cell. The memory cell 10 includes a source region 13 and a drain region 14, which are connected to each other by a channel 15. A gate oxide 16 is arranged above the channel. The gate oxide 16 insulates the channel 15 from a storage electrode 11. A second gate oxide 20 is arranged above the storage electrode 11. The second gate oxide 20 insulates a gate electrode 12, which is arranged above the second gate oxide 20, from the storage electrode 11. In addition, the gate stack is surrounded by insulation 21. The gate electrode 12 forms a capacitive voltage divider with the storage electrode 11 and the channel 15. If a positive voltage is applied to the gate electrode 12 with respect to the substrate 28, then given a sufficiently high field strength, electrons tunnel out of the channel 15 onto the storage electrode 11 and negatively charge the storage electrode 11. Since the storage electrode 11 is completely insulated by the gate oxide 16, the second gate oxide 20, and the insulation 21, the negative charge on the storage electrode 11 is maintained even after the power supply has been switched off. As a result of the charge stored on the storage electrode 11, the turn-on voltage of the transistor 26 is shifted, so that the charge state of the storage electrode 11, and therefore, the value stored in the memory cell 10 can be read out. In order to erase the memory cell 10, a negative voltage is applied to the gate electrode 12 and a positive voltage to the source region 13. Since the source region 13 is then connected to the highest positive voltage, the electrons preferably flow out of the storage electrode 11 at the point that is closest to the source region 13. The tunnel current is concentrated onto the region of the corner or edge by the applied voltage and the geometry of the storage electrode 11, which has a corner or an edge in the vicinity of the source region 13. Therefore, the most severe degradation of the gate oxide occurs in this region.

In order to read from the memory cell 10, a first voltage is applied to the source region 13 and a second voltage is applied to the gate electrode 12. If there is no additional charge on the storage electrode 11, then the transistor turns on and a current flows from the source region 13 to the drain region 14. This current is assessed by read amplifiers and indicates the storage state of the memory cell. If there is additional charge on the storage electrode 11 which, for example, has passed to the storage electrode 11 as a result of a write operation, then the effective electrical field that is generated by the voltage of the gate electrode 12 is weakened by the charge located on the storage electrode 11, and the transistor remains off. In this case, no current flows from the source region 13 to the drain region 14.

Figure 5:
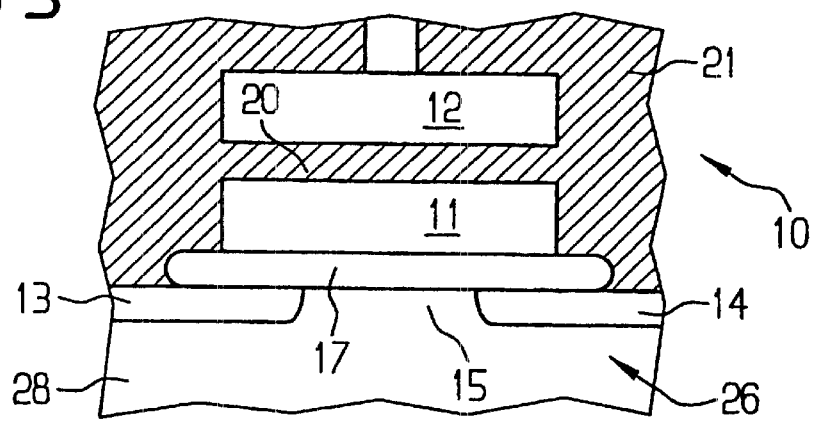
FIG. 5 shows an exemplary embodiment of an EPROM-like memory cell with an inventive tunnel contact.

FIG. 5 shows the integration of the inventive tunnel contact into an EPROM-like memory cell. The memory cell includes a source region 13 and a drain region 14, which are connected to each other by a channel 15. In this exemplary embodiment, there is no gate oxide above the channel 15, but instead there is a first implementation 17 of the interspace 3. The storage electrode 11 is located above the first implementation 17 of the interspace 3. The storage electrode 11 is insulated from the gate electrode 12 by the second gate oxide 20 that is located above the storage electrode 11. The gate electrode 12 is arranged above the gate oxide 20. In addition, this arrangement is surrounded by insulation 21. The channel 15 is slightly p-doped monocrystalline silicon, for example. The source region 13 and the drain region 14 consist of highly n-doped silicon, for example, and can be produced by implantation. In this exemplary embodiment, the storage electrode 11 consists of highly doped polysilicon, for example. In this embodiment, the second gate oxide 20 consists of silicon oxide, for example, and the gate electrode 12 consists of highly doped polysilicon. The insulation 21 that surrounds the arrangement is formed, for example, of undoped silicate glass or of boron-phosphorus silicate glass (BPSG). The first implementation 17 of the interspace 3 is, for example, filled with gas and insulates the storage electrode 11 from the source region 13, the drain region 14, and the channel 15. For this purpose, the first implementation 17 of the interspace 3 can be filled with inactive (inert) gases such as argon, nitrogen, helium, and so on. In addition, gas residues of the gases and gas mixtures that are used during the processing of the first implementation 17 of the interspace 3 can be contained in the interspace 3. Likewise, residual gases such as oxygen or silane, which are used during the production of the insulation 21, can be found in the interspace 3.

Figure 6:
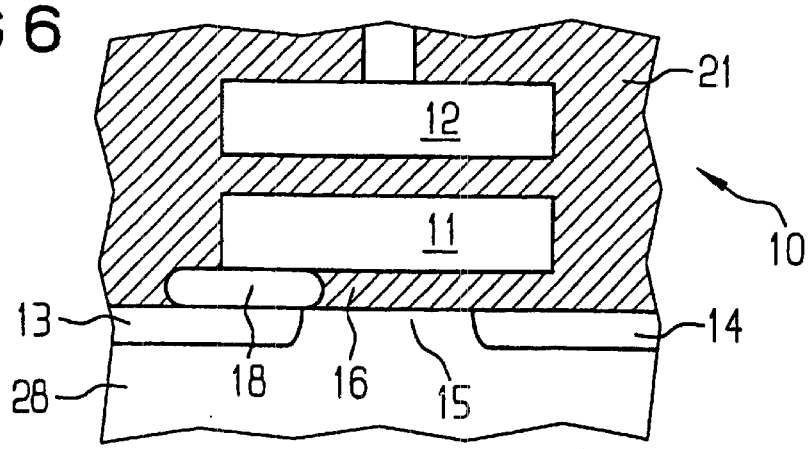
FIG. 6 shows another exemplary embodiment of an EPROM-like memory cell.

FIG. 6 shows another integration of the tunnel contact into an EPROM-like memory cell 10. In contrast to the situation shown in FIG. 5, the interspace 3 is not located under the entire storage electrode 11, but is preferably in the region, which during the writing or erasure of the memory cell 10, is stressed very highly. In conventional memory cells, the gate oxide 16 is usually damaged first in this highly stressed region. To prevent damage to the gate oxide 16, a left-hand implementation 18 of the interspace 3 is located between the source region 13 and the storage electrode 11. The gate oxide 16 is located between the channel 15 and the storage electrode 11. The gate oxide 16 additionally insulates the drain region 14 from the storage electrode 11. This arrangement is advantageous since, because of the applied voltage, whose difference is greatest between the source region 13 and the storage electrode 11, the electrons preferably tunnel from the storage electrode 11 through the left-hand implementation 18 of the interspace 3 into the source region 13. The localization of the tunnel current is additionally supported by the field geometry that is formed at the corner or edge of the storage electrode 11. Therefore, the gate oxide 16 can remain above the channel to the greatest possible extent and can remain between storage electrode 11 and the drain region 14, since the gate oxide 16 is not damaged by tunnel currents.

Figure 7A:
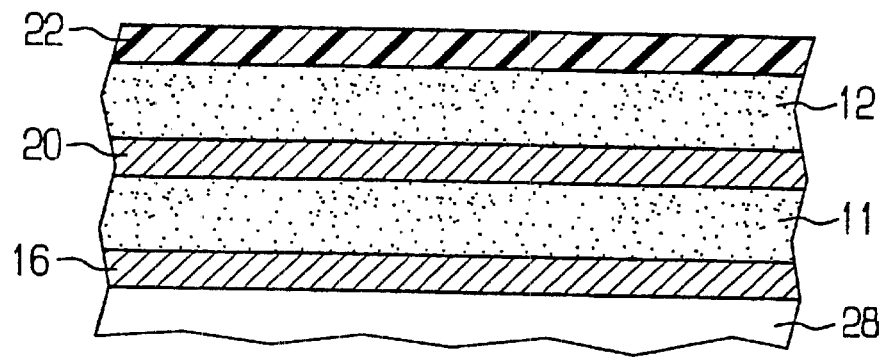
FIGS. 7A–E illustrate an embodiment of a method for producing an EPROM-like memory cell with a tunnel contact.

Referring to FIG. 7A, a suitable, for example, a slightly p-doped, substrate 28 is prepared. First of all, a sequence of layers is formed on the substrate 28. The gate stack is subsequently produced by structuring these layers. The sequence of layers begins with a dielectric layer which, for example, is produced by oxidation of the substrate 28. The gate oxide 16 will be produced from this dielectric layer by subsequent structuring. A conductive layer is subsequently formed over the dielectric layer that will form the gate oxide 16. This conductive layer will form the storage electrode 11. The storage electrode 11 consists, for example, of highly doped polysilicon. A dielectric layer is configured over the entire area of the highly-doped polysilicon. A second gate oxide 20 is formed from this dielectric layer. The second gate oxide 20 can, for example, be formed using a TEOS deposition (tetra ethyl ortho silicate) or by thermal oxidation of the storage electrode 11 lying underneath. A conductive layer is formed above the second gate oxide 20, and the gate electrode 12 is formed from this conductive layer. The gate electrode 12 can, for example, be formed from a doped polysilicon layer. Finally, a covering layer 22 is formed which, for example, consists of nitride and can be formed using CVD deposition processes.

Figure 7B:
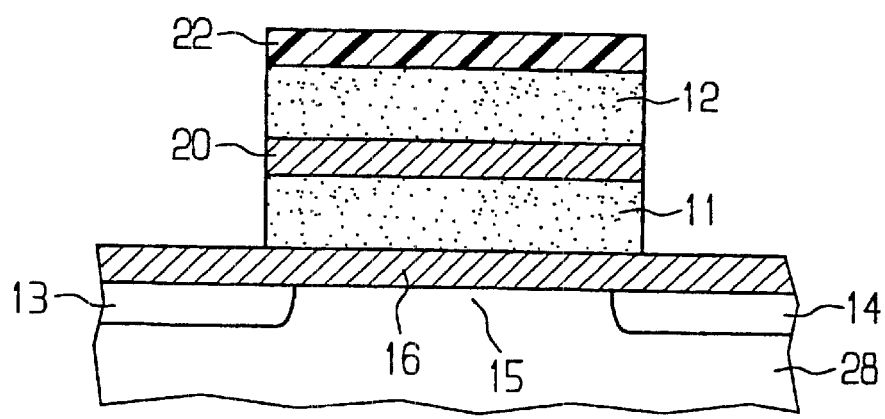

Referring to FIG. 7B, the formed layers are structured using conventional photolithography and etching techniques to form a gate stack. In the process, only the upper four layers are structured. The layer that forms the gate oxide 16 is maintained. At this time, LDD implantation (lightly doped drain) can optionally be carried out.

Figure 7C:
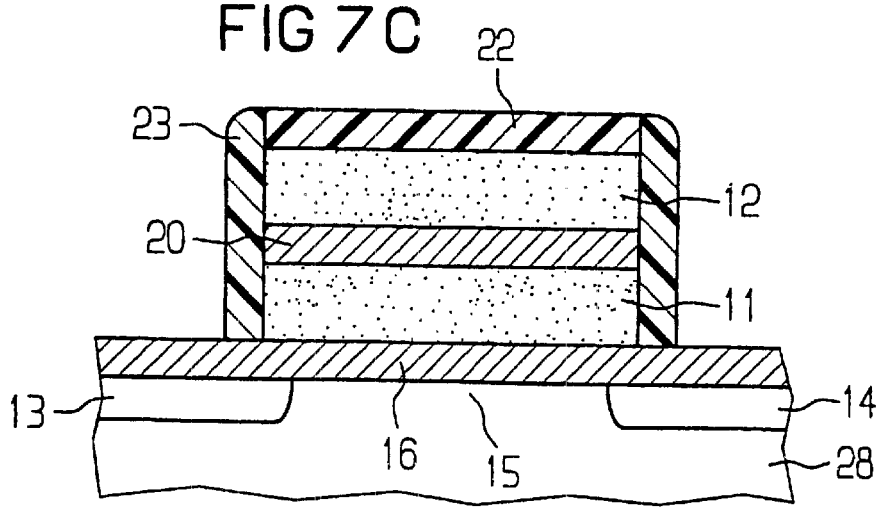

As FIG. 7C shows, a spacing web 23 is then formed, which consists, for example, of nitride. The spacing web 23 is used to mask the subsequent implantation of the source region 13 and the drain region 14.

Figure 7D:
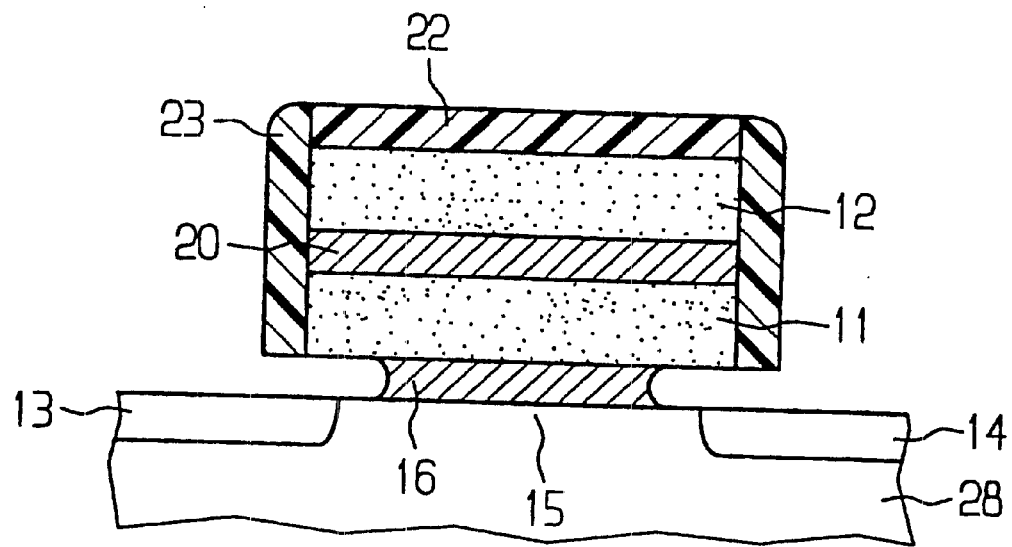

Referring to FIG. 7D, the gate oxide 16 is then removed by etching selectively with respect to silicon and silicon nitride. Since the etching is isotropic etching, the gate stack is etched underneath to some extent. To etch the gate oxide 16, for example, wet chemical etching that contains buffered hydrofluoric acid (HF) can be used.

Figure 7E:
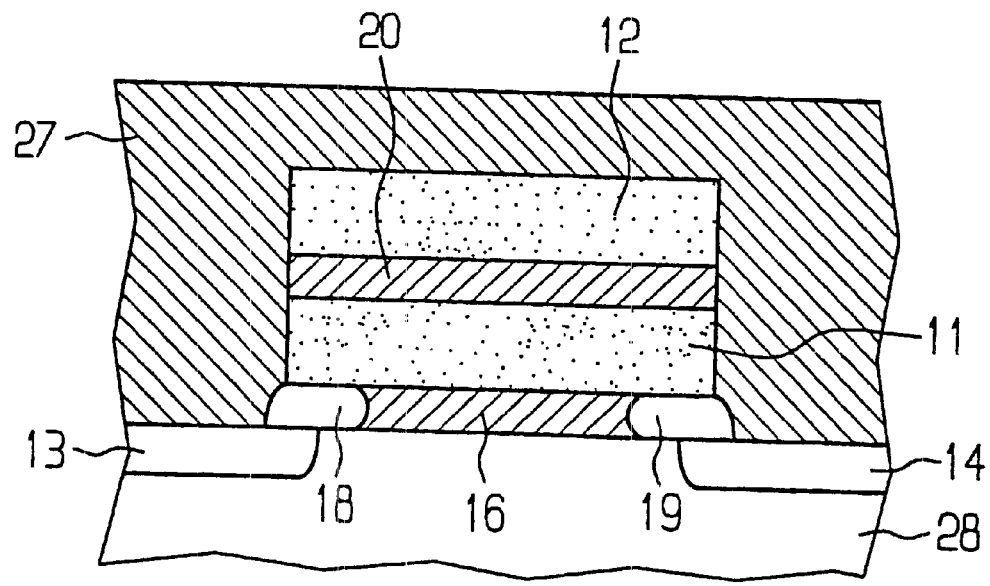

With reference to FIG. 7E, the covering layer 22 and the spacing web 23 are removed, which both consist of nitride in this exemplary embodiment. This can be done, for example, by wet chemical etching, which etches the nitride selectively with respect to oxide and silicon. A dielectric layer 27 which has poor edge coverage is then deposited. As a result, the left-hand implementation 18 of the interspace 3 and the right-hand implementation 19 of the interspace 3 are formed. The dielectric layer 27 can consist of oxide, for example.

Because of its good edge coverage, TEOS (Tetra Ethyl Ortho Silicate) not as suitable as a deposition process with poor edge coverage for depositing the dielectric layer 27. Poorer edge coverage is, for example, achieved with PECVD (Plasma enhanced CVD) or LTO (Low Temperature Oxide). Most suitable at present is a silane oxide, which has poor edge coverage and which can be carried out at about 1000 hPa and at a temperature of about 430° C.

Further processing of the EPROM-like memory cell 10 is carried out in accordance with the prior art. In the process, inter alia the source region 13, the drain region 14 and the gate electrode 12 are electrically connected.

Figure 8A:
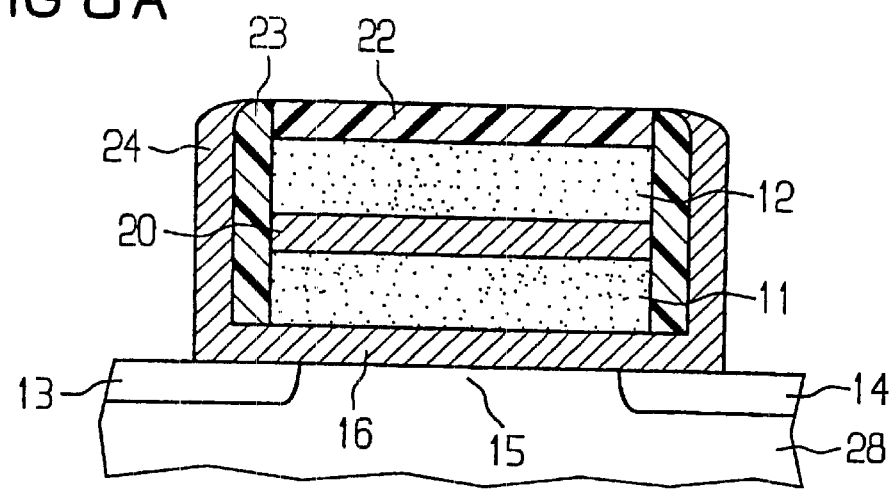
FIGS. 8A–D show another embodiment of a method for producing an EPROM-like memory cell.

FIG. 8A illustrates a further method of producing an EPROM-like memory cell 10 with the inventive tunnel contact. First, a substrate is prepared, which consists of silicon, and for example, is lightly p-doped. A sequence of layers is produced on the substrate, beginning with a dielectric layer that will form the gate oxide 16. For this purpose, the substrate is, for example, oxidized thermally. A conductive layer, which will form the storage electrode 11, is deposited onto the dielectric layer. For example, the layer that will form the storage electrode 11 consists of doped polysilicon. A further layer that will form the second gate oxide 20 is produced over the layer that will form storage electrode 11. This layer consists, for example, of silicon oxide and can be produced by TEOS deposition or by thermal oxidation of the layer lying underneath that will form the storage electrode 11. A further conductive layer, which will form the gate electrode 12, is deposited over the layer that will form the second gate oxide 20. This layer conductive layer consists of, for example, doped polysilicon. Finally, a further layer is deposited that forms the covering layer 22. The covering layer 22 consists of, for example, silicon nitride and can be produced by CVD deposition. Then, using a photolithographic step, the gate stack is defined and is structured by appropriate etching steps. In the process, first of all, the gate oxide 16 is left standing, serving as a stray oxide for optional LDD implantation. After that, first, the spacing web 23 is formed. The spacing web 23 is arranged laterally on the gate stack and consists of, for example, nitride. In addition, a sacrificial spacing web 24 is formed which, in this exemplary embodiment, consists of oxide and is arranged laterally on the gate stack, beside the spacing web 23.

Figure 8B:
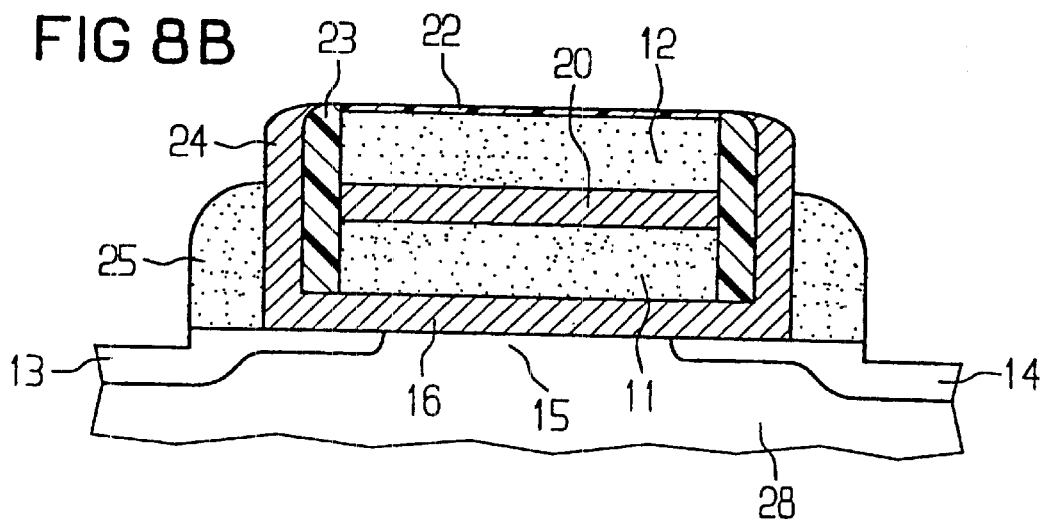

FIG. 8B shows an outer spacing web 25 that is formed laterally on the gate stack, beside the sacrificial spacing web 24. In this exemplary embodiment, the outer spacing web 25 consists of polysilicon. Masked by the three spacing webs 23, 24 and 25, the source region 13 and the drain region 14 can be the implanted. In the process, the outer spacing web 25, which consists of polysilicon in this exemplary embodiment, is likewise doped.

Figure 8C:
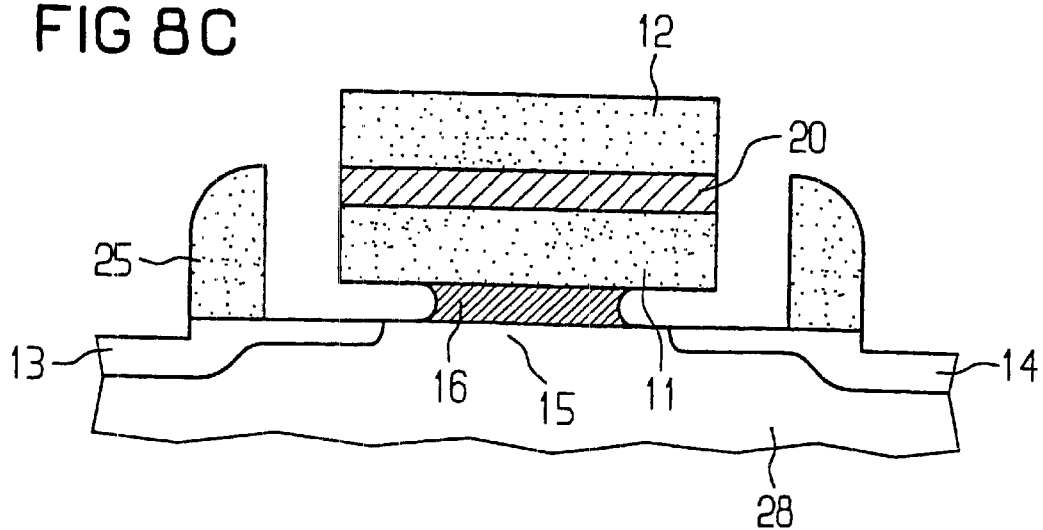

FIG. 8C shows how the sacrificial spacing web 24, which consists of silicon oxide in this exemplary embodiment, is removed by etching. The etching is preferably anisotropic etching. In the process, the oxide etching is continued until the storage electrode 11 has to some extent been etched underneath. The covering layer 22 and the spacing web 23 are then removed, which both consist of nitride in this exemplary embodiment. For this purpose, selective nitride etching, for example, is used.

Figure 8D:
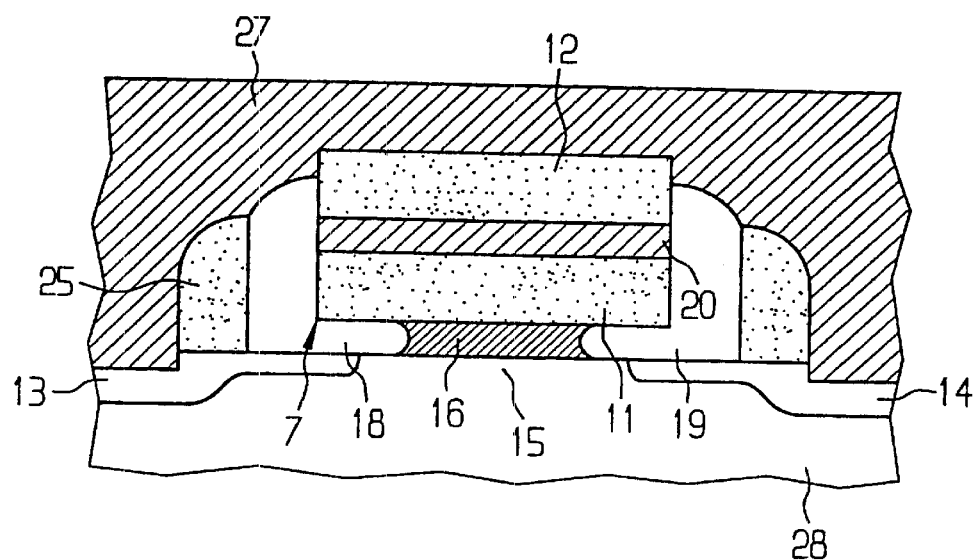

Referring to FIG. 8D, a dielectric layer 27 is formed. The dielectric layer 27 has poor edge coverage, so that the left-hand implementation 18 of the interspace 3 and the right-hand implementation 19 of the interspace 3 is formed on the flanks of the gate stack and underneath the storage electrode 11. In this exemplary embodiment, the storage electrode 11 has a second region 7, which represents an edge. As a result of its geometry, the edge forms a highly divergent field when a voltage is applied and permits the tunnel current that flows between the storage electrode 11 and the source region 13 to flow preferentially through the second region 7. The outer spacing web 25 influences the field distribution during the programming or erasing of the memory cell 10 such that the tunnel current substantially flows via the corner or the edge of the storage electrode. This corner or edge is the second region 7. As a result, it is possible to dispense with a diffusion under the source region 13 and the drain region 14, which would unnecessarily shorten the channel.

The subsequent processing for fabricating the inventive memory cell is carried out as is known from the prior art.

I claim:

1. A non-volatile memory cell, comprising:

a substrate having a source region, a drain region, and a channel;

a gate stack formed by a first gate oxide, a storage electrode, a second gate oxide and a gate electrode, said first gate oxide configured on said substrate above said channel, said storage electrode configured above said first gate oxide, said second gate oxide configured above said storage electrode, said gate electrode configured on said second gate oxide;

an interspace formed below said storage electrode;

said interspace formed above a region selected from the group consisting of said source region and said drain region;

said interspace being in a state selected from the group consisting of a gas-containing state and a vacuum-containing state; and an outer spacing web having doped silicon and configured laterally adjacent said gate stack and said interspace, said outer spacing web separated from said gate and storage electrodes and contacting one of said source region and said drain region.

2. The non-volatile memory cell according to claim 1, wherein said interspace is configured above another region selected from the group consisting of said source region and said drain region.

3. The non-volatile memory cell according to claim 1, wherein said interspace is configured above another region selected from the group consisting of said source region and said drain region.

4. The non-volatile memory cell according to claim 3, wherein said interspace is configured between said channel and said storage electrode.

5. The non-volatile memory cell according to claim 1, wherein:

said interspace contains a gas; and said interspace is embodied such that a current between said storage electrode and said region, which is selected from the group consisting of said source region and said drain region, at least partially tunnels through said gas.

6. The non-volatile memory cell according to claim 1, wherein:

said interspace contains a vacuum; and said interspace is embodied such that a current between said storage electrode and said region, which is selected from the group consisting of said source region and said drain region, at least partially tunnels through said vacuum.

7. The non-volatile memory cell according to claim 1, wherein:

said interspace contains a gas; and said interspace is embodied such that a current between said storage electrode and said region, which is selected from the group consisting of said source region and said drain region, tunnels entirely through said gas.

8. The non-volatile memory cell according to claim 1, wherein:

said interspace contains a vacuum; and said interspace is embodied such that a current between said storage electrode and said region, which is selected from the group consisting of said source region and said drain region, tunnels entirely through said vacuum.

9. The non-volatile memory cell according to claim 1, wherein said storage electrode can be charged through said interspace.

10. The non-volatile memory cell according to claim 9, wherein said storage electrode can be discharged through said interspace.

11. The non-volatile memory cell according to claim 1, wherein said storage electrode can be discharged through said interspace.

* * * * *